(12) United States Patent
Kim et al.

(10) Patent No.: US 7,888,768 B2
(45) Date of Patent: Feb. 15, 2011

(54) POWER INTEGRATED CIRCUIT DEVICE HAVING EMBEDDED HIGH-SIDE POWER SWITCH

(75) Inventors: Sung-lyong Kim, Gyeonggi-do (KR); Chang-ki Jeon, Gyeonggi-do (KR); Jong-jib Kim, Seoul (KR); Jong-tae Hwang, Seoul (KR)

(73) Assignee: Fairchild Korea Semiconductor, Ltd., Bucheon (KR)

( * ) Notice: Subject to any disclaimer, the term of this patent is extended or adjusted under 35 U.S.C. 154(b) by 316 days.

(21) Appl. No.: 11/329,268

(22) Filed: Jan. 9, 2006

(65) Prior Publication Data

US 2007/0158681 A1 Jul. 12, 2007

(51) Int. Cl.
*H01L 21/70* (2006.01)
*H01L 21/77* (2006.01)
(52) U.S. Cl. .............. 257/500; 257/499; 257/504; 257/544; 257/E21.598
(58) Field of Classification Search .......... 257/216, 257/235, 241, 256, 272, 274, 279, 287, 289, 257/367, 368, 392, 394, 400, 401, 393, 134, 257/146, 162, 175, 176, 498, 501, 500, 499, 257/503, 504, 544, 545, 546, 547, 549, 550, 257/E21.598
See application file for complete search history.

(56) References Cited

U.S. PATENT DOCUMENTS

| | | | |
|---|---|---|---|
| 4,494,134 A | 1/1985 | Wildi et al. | |
| 4,661,838 A | 4/1987 | Wildi et al. | |
| 4,663,547 A * | 5/1987 | Baliga et al. | 327/377 |
| 4,740,821 A * | 4/1988 | Bertotti et al. | 257/273 |
| 4,862,242 A | 8/1989 | Wildi et al. | |
| 4,866,495 A | 9/1989 | Kinzer | |
| 4,868,620 A | 9/1989 | Kohl et al. | |
| 4,942,440 A | 7/1990 | Baliga et al. | |

(Continued)

OTHER PUBLICATIONS

Baliga, B. Jayant, Power Semiconductor Devices, Boston MA: PWS Publishing Company, 1996. pp. 357-358.*

(Continued)

*Primary Examiner*—Phat X Cao
*Assistant Examiner*—Diana C Garrity
(74) *Attorney, Agent, or Firm*—Sidley Austin LLP (57) ABSTRACT

In one embodiment, a power integrated circuit device is provided. The power integrated circuit device includes a high-side power switch having a high voltage transistor and a low voltage transistor. The high voltage transistor has a gate, a source, and a drain, and is capable of withstanding a high voltage applied to its drain. The low voltage transistor has a gate, a source, and a drain, wherein the drain of the low voltage transistor is connected to the source of the high voltage transistor and the source of the low voltage transistor is connected to the gate of the high voltage transistor, and wherein a control signal is applied to the gate of the low voltage transistor from the power integrated circuit device. The high-side power switch is turned on when a predetermined voltage is applied to the source of the low voltage transistor, a voltage higher than the predetermined voltage is applied to the drain of the high voltage transistor, and a voltage level of the control signal becomes higher than the predetermined voltage by a threshold voltage of the low voltage transistor.

12 Claims, 9 Drawing Sheets

U.S. PATENT DOCUMENTS

| | | | | |
|---|---|---|---|---|
| 4,959,697 A | * | 9/1990 | Shier et al. | 257/279 |
| 2002/0017683 A1 | * | 2/2002 | Jeon | 257/339 |
| 2005/0253218 A1 | * | 11/2005 | Jeon et al. | 257/500 |
| 2006/0071247 A1 | * | 4/2006 | Chen et al. | 257/272 |
| 2006/0163709 A1 | * | 7/2006 | Anderson et al. | 257/678 |
| 2008/0067560 A1 | * | 3/2008 | Knaipp | 257/285 |

OTHER PUBLICATIONS

P. Friedrichs, H. Mitlehner, K. O. Dohnke, D. Peters, R. Schörner, U. Weinert, E. Baudelot, and D. Stephani, "Power devices with low on-resistance for fast switching applications", Proceedings of the ISPSD '00. Toulouse, May 22-25, 1999. pp. 213-216.*

A. Mihaila, F. Udrea, R. Azar, G. Brezeanu, and G. Amaratunga, "Static and Dynamic Behaviour of SiC JFET/Si MOSFET Cascade Configuration for High-Performance Power Switches," Materials Science Forum, vols. 389-393 (2002) pp. 1239-1242.*

* cited by examiner

POWER INTEGRATED CIRCUIT DEVICE HAVING EMBEDDED HIGH-SIDE POWER SWITCH

BACKGROUND OF THE INVENTION

1. Field of the Invention

The present invention relates to a power integrated circuit device, and more particularly, to a power integrated circuit device having an embedded high side-power switch.

2. Description of the Related Art

Integrated circuit devices can be classified into integrated circuit devices operating at a low voltage (e.g., 30V or less) and power integrated circuit devices operating at a high voltage (e.g., 100V or more). Although high voltages are applied to the power integrated circuit devices, the power integrated circuit devices must normally operate without failure. Thus, the power integrated circuit devices have different structures from the integrated circuit devices operating at low voltages. Furthermore, is difficult to incorporate or embed semiconductor devices operating at a very high voltage (e.g., 600V) in integrated circuit devices. Thus, the very high voltage semiconductor devices are separate from integrated circuit devices and must be externally connected thereto. These problems with previous designs are explained in more detail with reference to FIGS. 1 and 2.

Figure 1:
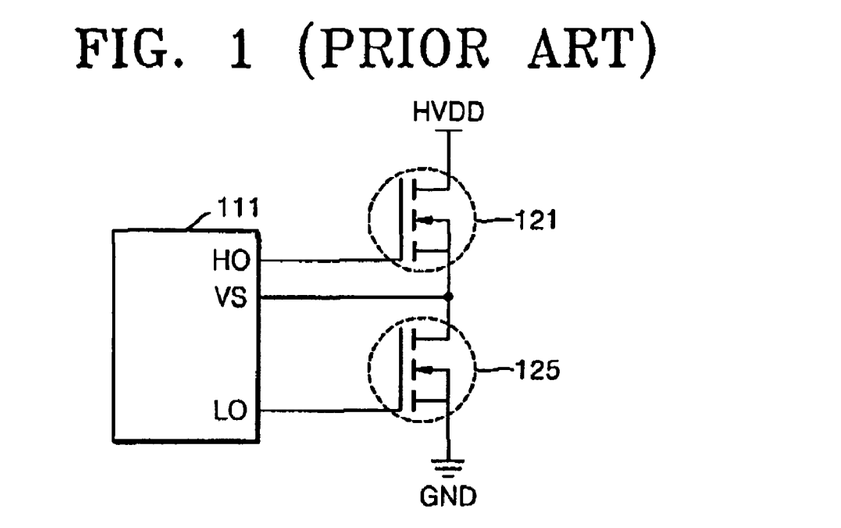
FIG. 1 is a schematic diagram illustrating a power integrated circuit device to which high-side and low-side power switches are connected externally.

FIG. 1 is a schematic diagram illustrating a power integrated circuit device 111 to which high-side and low-side power switches 121 and 125 are connected externally. Referring to FIG. 1, the high-side and low-side power switches 121 and 125 are N-channel metal-oxide semiconductor field-effect transistors (MOSFETs)

In a typical implementation for the high-side power switch 121 performing a switching operation, a very high voltage HVDD, for example, of 600V, is connected to a drain of the high-side power switch 121, and substrate voltage Vs (or a ground voltage GND) of a high voltage region is connected to a source of the high-side power switch 121. Since a very high voltage is connected to the high-side power switch 121, the high-side power switch 121 must be capable of enduring the very high voltage. Thus, it is difficult to embed the high-side power switch 121 in the power integrated circuit device 111. As such, the high-side power switch 121 is implemented separately from the power integrated circuit device 111.

Figure 2:
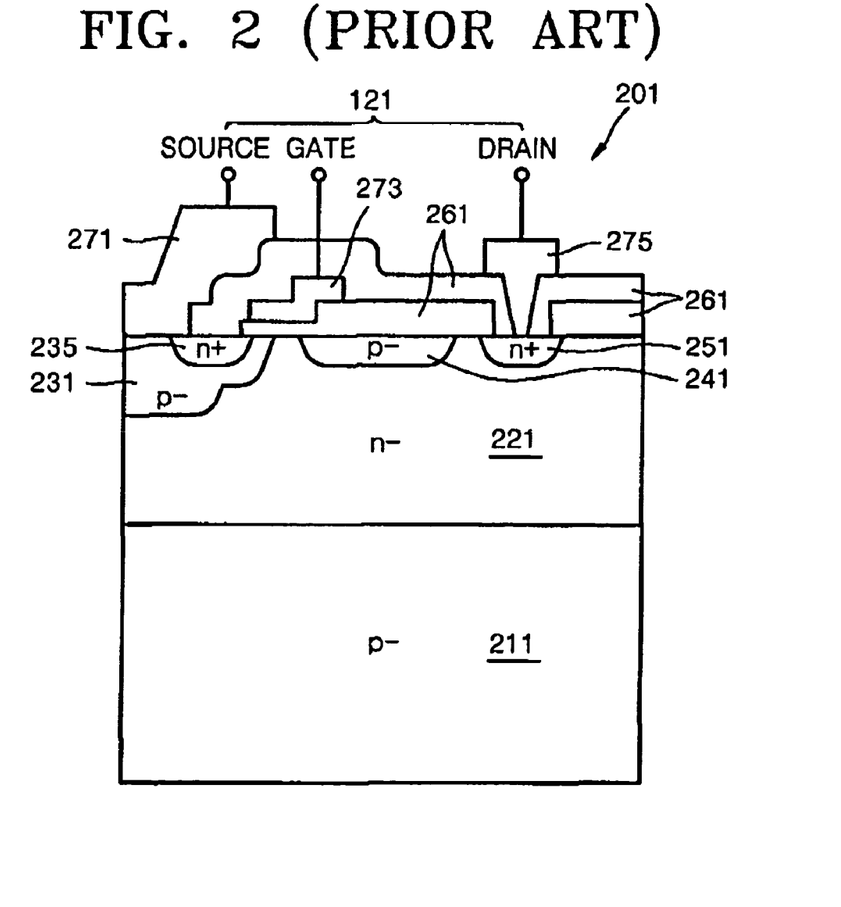
FIG. 2 is a cross-sectional view of a conventional power integrated circuit device including the high-side power switch shown in FIG. 1.

FIG. 2 is a cross-sectional view of a conventional power integrated circuit device 201 in which the high-side power switch 121 shown in FIG. 1 can be embedded. Such a power integrated circuit device 201 shown in FIG. 2 is disclosed in U.S. Pat. No. 4,866,495.

Referring FIG. 2, the power integrated circuit device 201 includes a semiconductor substrate 211, an epitaxial layer 221, a body area 231, a source area 235, a top area 241, a drain area 251, a source electrode 271, a gate electrode 273, and a drain electrode 275.

Here, the source area 235, the gate electrode 273, and the drain area 251 constitute the high-side power switch 121.

When a predetermined voltage is applied to the drain electrode 275 and a voltage applied to the gate electrode 273 is equal to or exceeds a threshold voltage of an N-channel MOSFET compared to a voltage applied to the source electrode 271, the high-side power switch 121 is turned on. When the high-side power switch 121 is turned on, a current flows from the drain electrode 275 to the source electrode 271. Here, if the body area 231 is deeply formed into the epitaxial layer 221, a current path readily forms between the body area 231 and the semiconductor substrate 211. Thus, a substantial current may flow from the body area 231 to the semiconductor substrate 211. This phenomenon is known as "punch-through." When punch-through occurs, the high-side power switch 121 fails to perform the switching operation normally. Therefore, in order to avoid or prevent punch through from occurring, the body area 231 of the high-side power switch 121 can be thinly formed into the epitaxial layer 221.

However, if the body area 231 is thin, a pinch resistance of the source area 235 is reduced. As a result, a displacement voltage dV/dt deteriorates. More specifically, a current characteristic of the high-side power switch 121 can be expressed by Equation 1 as follows:

$$I = C \times \frac{dV}{dt} \quad (1)$$

where I denotes a displacement current, C denotes a capacitance, and dV/dt denotes a displacement voltage.

As shown in Equation 1, the displacement current I is formed by the displacement voltage dV/dt and flows through the body area 231 to the source electrode 271. A parasitic transistor among the source area 235, the body area 231, and the epitaxial area 221 may conduct. Thus, the high-side power switch 121 does not operate normally as a power switch. In other words, the displacement voltage dV/dt deteriorates.

SUMMARY

In one embodiment, the present invention provides a power integrated circuit device including a high-side power switch having a high switch characteristic and an improved displacement voltage characteristic.

According to an aspect of the present invention, a power integrated circuit device is provided. The power integrated circuit device includes a high-side power switch having a high voltage transistor and a low voltage transistor. The high voltage transistor has a gate, a source, and a drain, and is capable of withstanding a high voltage applied to its drain. The low voltage transistor has a gate, a source, and a drain, wherein the drain of the low voltage transistor is connected to the source of the high voltage transistor and the source of the low voltage transistor is connected to the gate of the high voltage transistor, and wherein a control signal is applied to the gate of the low voltage transistor from the power integrated circuit device. The high-side power switch is turned on when a predetermined voltage is applied to the source of the low voltage transistor, a voltage higher than the predetermined voltage is applied to the drain of the high voltage transistor, and a voltage level of the control signal becomes higher than the predetermined voltage by a threshold voltage of the low voltage transistor.

In one embodiment, the high voltage transistor of the high-side power switch comprises an N-channel junction field-effect transistor, and the low voltage transistor comprises an N-channel metal-oxide field-effect transistor.

According to another aspect of the present invention, a power integrated circuit device includes the following: a semiconductor substrate; an epitaxial layer formed on the semiconductor substrate; a first drain area formed in an upper portion of the epitaxial layer; a first body area formed in the upper portion of the epitaxial layer apart from the first drain area; a first gate area formed in an upper portion of the first body area; a first source area formed in the upper portion of the epitaxial layer apart from the first body area; a second body area formed in the epitaxial layer; a second drain area formed in an upper portion of the second body area; a second source area formed in the upper portion of the second body area apart from the second drain area; a gate electrode formed in an upper portion between the second drain area and the second source area; a first metal line formed on an upper surface of the epitaxial layer and electrically connecting the first gate area to the second source area; and a second metal line formed on the upper surface of the epitaxial layer and electrically connecting the first source area to the second drain area.

Important technical advantages of the present invention are readily apparent to one skilled in the art from the following figures, descriptions, and claims.

BRIEF DESCRIPTION OF THE DRAWINGS

The above and other features and advantages of the present invention will become more apparent by describing in detail exemplary embodiments thereof with reference to the attached drawings in which:

FIG. 6A is a cross-sectional view illustrating current flowing in the high-side power switch when the high-side power switch is turned on;

FIG. 6B is a graph illustrating a current characteristic of the high-side power switch when the high-side power switch is turned on;

DETAILED DESCRIPTION OF THE INVENTION

Hereinafter, the present invention will be described in detail by explaining preferred embodiments of the invention with reference to the attached drawings. Like reference numerals in the drawings denote like elements.

Figure 3:
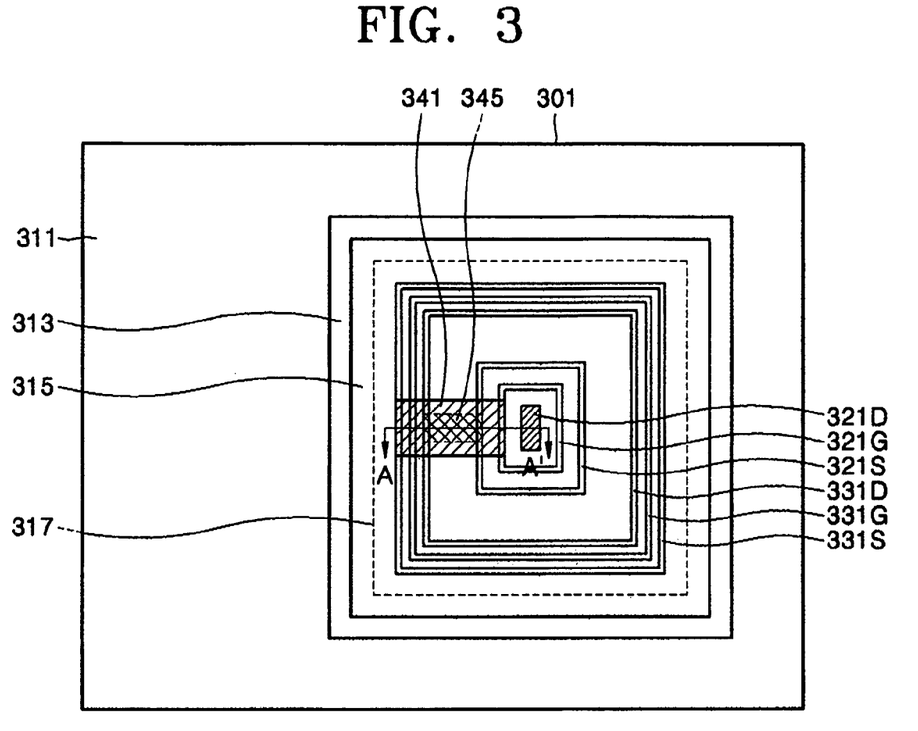
FIG. 3 is a plan view of a power integrated circuit device having a high-side power switch according to an embodiment of the present invention.

FIG. 3 is a plan view of a power integrated circuit device 301 including a high-side power switch according to an embodiment of the present invention. As shown, power integrated circuit device 301 includes a low voltage area 311, a junction termination 313, a high voltage area 315, and a high-side power switch 317.

In the low voltage area 311, semiconductor devices which should operate at a low voltage (e.g., 30V or less) may be formed. In the high voltage area 315, semiconductor devices which should operate at a high voltage (e.g., 100V or more) may be formed. The junction termination 313 electrically isolates the low voltage area 311 from the high voltage area 315. This prevents the semiconductor devices formed in the low voltage area 311 from breaking down, and thus not operating, when a high voltage is applied to the high voltage area 315.

The high-side power switch 317 is formed in the high voltage area 315. The high-side power switch 317 may include two transistors. In one embodiment, as shown, the high-side power switch 317 has a first drain electrode 321D, a first gate electrode 321G, a first source electrode 321S, a second drain electrode 331D, a second gate electrode 331G, a second source electrode 331S, and first and second metal lines 341 and 345.

The first drain electrode 321D, the first gate electrode 321G, and the first source electrode 321S form the first transistor, which can be a junction field effect transistor (JFET). The second drain electrode 331D, the second gate electrode 331G, and the second source electrode 331S form the second transistor, which can be a metal-oxide-semiconductor field effect transistor (MOSFET).

The first metal line 341 electrically connects the gate electrode 321G of the first transistor to the source electrode 331S of the second transistor, and the second metal line 345 electrically connects the source electrode 321S of the first transistor to the drain electrode 331D of the second transistor.

Figure 4:
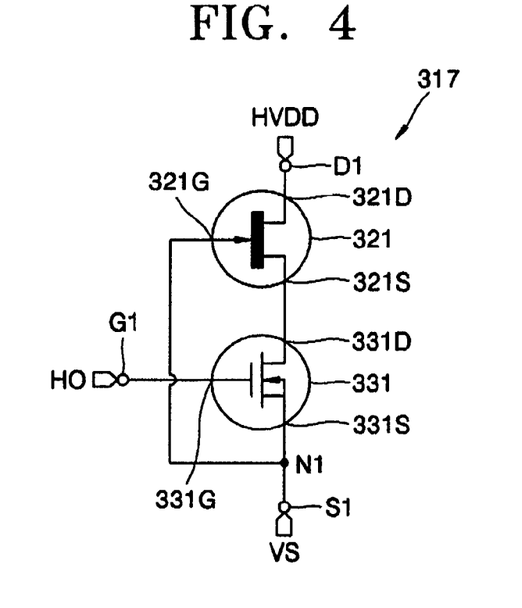
FIG. 4 is a schematic diagram of a high-side power switch according to an embodiment of the present invention.

FIG. 4 is a schematic diagram of a high-side power switch 317 according to an embodiment of the present invention. As shown, the high-side power switch 317 includes a high voltage transistor 321 (which can be an N-channel JFET), a low voltage transistor 331 (which can be an N-channel MOSFET), a drain terminal D1, a gate terminal G1, and a source terminal S1. The high voltage transistor 321 operates at a high voltage (e.g. 600V) and the low voltage transistor 331 operates at a low voltage (e.g., 30V or less).

A high voltage HVDD, for example, 600V, is applied to a drain 321D of the high voltage transistor 321. A gate 321G of the high voltage transistor 321 is connected to a source 331S of the low voltage transistor 331, and a source 321S of the high voltage transistor 321 is connected to a drain 331D of the low voltage transistor 331. A control signal HO, which may be generated by the power integrated circuit device 301 shown in FIG. 3, is applied to a gate 331G of the low voltage transistor 331. The control signal HO has a low voltage level, for example, between 0V and 30V. A reference voltage Vs of a high voltage area of the power integrated circuit device 301 shown in FIG. 3 and the low-side power switch 125 shown in FIG. 1 are connected to a node N1.

The high-side power switch 317 includes the two transistors 321 and 331, but is connected to the three external signals HVDD, HO, and Vs.

A threshold voltage of the high voltage transistor 321 can be a negative voltage, for example, about −20V. Thus, a current flows in the high-voltage transistor 321 until a voltage difference between the gate 321G and the source 321S is −20V or more. When the voltage level of the control signal HO becomes greater than a voltage applied to the node N1 by the threshold voltage of the low voltage transistor 331, the low voltage transistor 331 is turned on.

The description of the overall operation of the high-side power switch 317 continues as follows.

If the difference between the voltage level of the control signal HO and the voltage applied to the node N1 is less than the threshold voltage of the low voltage transistor 331, the high-side power switch 317 is turned off. Alternatively, if difference between the voltage level of the control signal HO and the voltage applied to the node N1 is greater than the threshold voltage of the low voltage transistor 331, the high-side power switch 317 is turned on.

Figure 5:
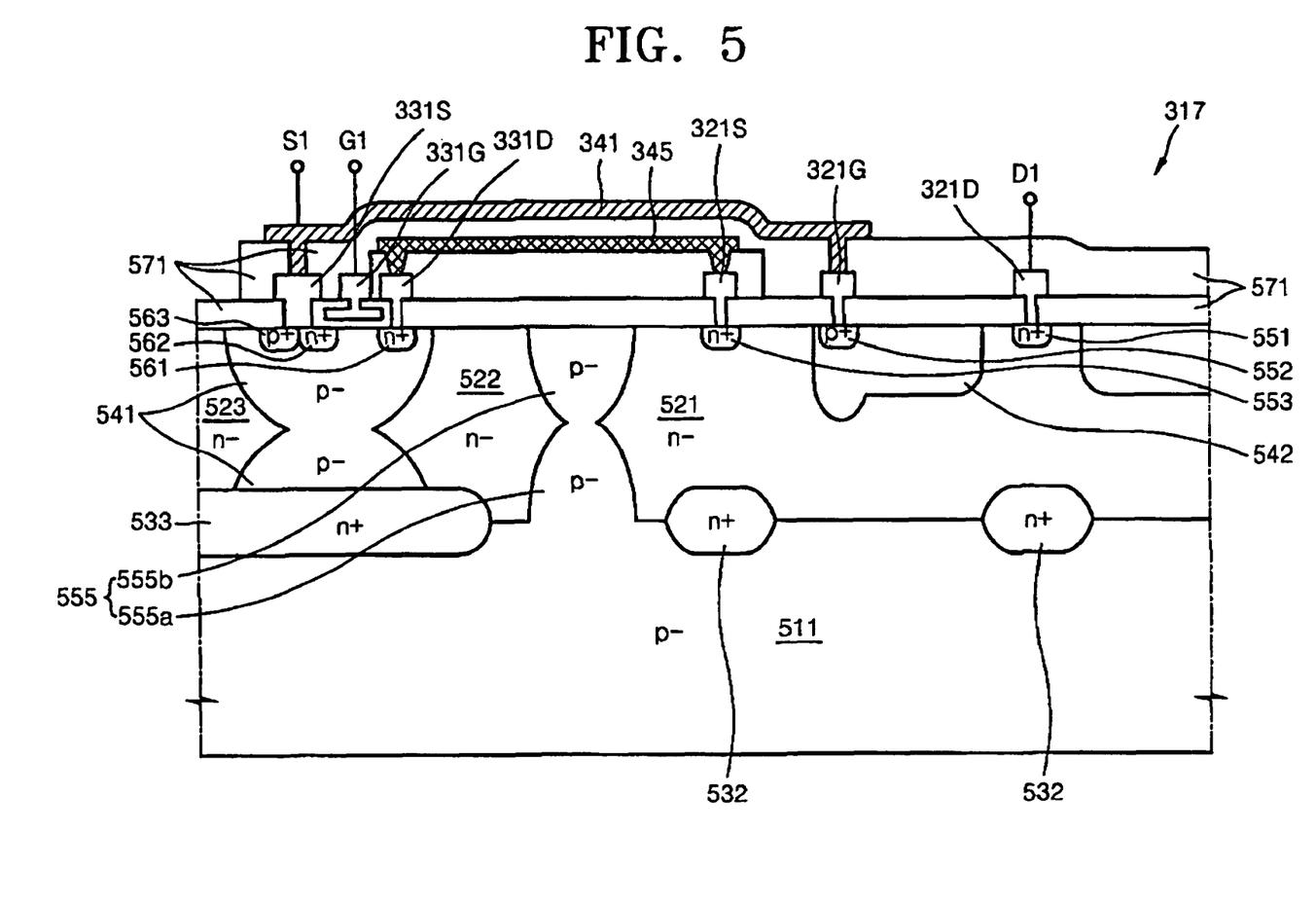
FIG. 5 is a cross-sectional view of the power integrated circuit device shown in FIG. 3 taken along line A-A'.

FIG. 5 is a cross-sectional view of the power integrated circuit device shown in FIG. 3 taken along line A-A' Referring to FIG. 5, in one embodiment, the high-side power switch 317 includes a semiconductor substrate 511, epitaxial layers 521, 522, and 523, buried layers 532 and 533, body areas 541 and 542, an isolation area 555, a first drain area 551, a first gate area 552, a first source area 553, a second drain area 561, second source areas 562 and 563, the first drain electrode 321D, the first gate electrode 321G, the first source electrode 321S, the second drain electrode 331D, the second gate electrode 331G, the second source electrode 331S, the first and second metal lines or wirings 341 and 345, and an insulating layer 571.

The semiconductor substrate 511 can be formed with a low density of p-type impurities. A substrate ground voltage (i.e., 0V) of the power integrated circuit device 301 (shown in FIG. 3) is applied or connected to the semiconductor substrate 511.

The epitaxial layers 521, 522, and 523 may be formed with a light concentration of n-type impurities or dopants on the semiconductor substrate 511. The buried layers 532 and 533 can be formed with a heavy concentration of n-type dopants between the epitaxial layers 521, 522, and 523 and the semiconductor substrate 511. The buried layer 532 allows the isolation area 555 to be completely depleted so as to endure a high voltage, and the buried layer 533 prevents a current from flowing from the second source areas 562 and 563 to the semiconductor substrate 511. The body area 541 is formed on the buried layer 533 so as to be vertically adjacent to the buried layer 533.

The isolation area 555 is formed on the semiconductor substrate 511. The isolation area 555 includes a buried layer 555a formed with a low concentration of p-type dopant and an impurity layer 555b also formed with a low concentration of p-type dopant. The impurity layer 555b is formed on the buried layer 555a so as to be vertically adjacent to the buried layer 555a. The isolation area 555 isolates the epitaxial layers 521 and 522 from each other.

The second drain area 561 and the second source areas 562 and 563 are formed in an upper portion of the body area 541. The second drain area 561 is formed with a high concentration of n-type impurities 561a and low concentration of n-type impurities 561b, and the second source areas 562 and 563 are formed with high concentrations of n-type and p-type impurities, respectively. The second drain electrode 331D is formed on and thus contacts the second drain area 561, and the second source electrode 331S is formed on and thus contacts the second source areas 562 and 563. The second gate electrode 331G is formed above a portion between the second drain area 561 and the second source areas 562 and 563.

As described above, the body area 541 is widely formed, thus reducing a pinch resistance. Also, the body area 541 is isolated from the epitaxial layer 521 of the first drain area 551 by the isolation area 555, thereby preventing a displacement current from flowing from the second source areas 562 and 563 to the semiconductor substrate 511.

In general, according to Equation 1 above, the displacement current flows between the high voltage transistor 321 and the low voltage transistor 331 and the semiconductor substrate 511. This is due to a capacitance between the semiconductor substrate 511 and the epitaxial layers 521, 522, and 523, and the displacement voltage dV/dt of the high voltage transistor 321 and the low voltage transistor 331. The displacement current induces a parasitic capacitance to operate. Thus, to prevent the displacement current, the body area 541 is widely and deeply formed on the buried layer 533 as shown in FIG. 5 so as to improve the displacement voltage dV/dt. Also, the body area 541 is isolated from the epitaxial layer 521 of the first drain area 551 by the isolation area 555, thereby preventing the generation of the displacement current.

The first drain area 551 is formed inside the epitaxial layer 521, and the first source area 553 is formed above the buried layer 532. The body area 542 and the first gate area 552 are formed between the first drain area 551 and the first source area 553. The first drain area 551 and the first source area 553 are formed with high concentrations of n-type dopants. The body area 542 is formed with a low concentration of p-type dopants, and the first gate area 552 is formed with high concentration of p-type dopants. The first drain electrode 321D is formed on and thus contacts the first drain area 551. The first source electrode 321S is formed on and thus contacts the first source area 553. Also, the first gate electrode 321G is formed on and thus contacts the first gate area 552.

The body area 542 can be widely formed. If a high voltage is applied to the first drain electrode 321D, the body area 542 is completely depleted so as to endure the high voltage. In other words, although the high voltage is applied to the first drain electrode 321D, the power integrated circuit device 301 shown in FIG. 3 can withstand the high voltage and not fail.

The first gate electrode 321G is connected to the second source electrode 331S through the first metal line 341, and the first source electrode 321 is connected to the second drain electrode 331D through the second metal line 345.

Figure 6A:
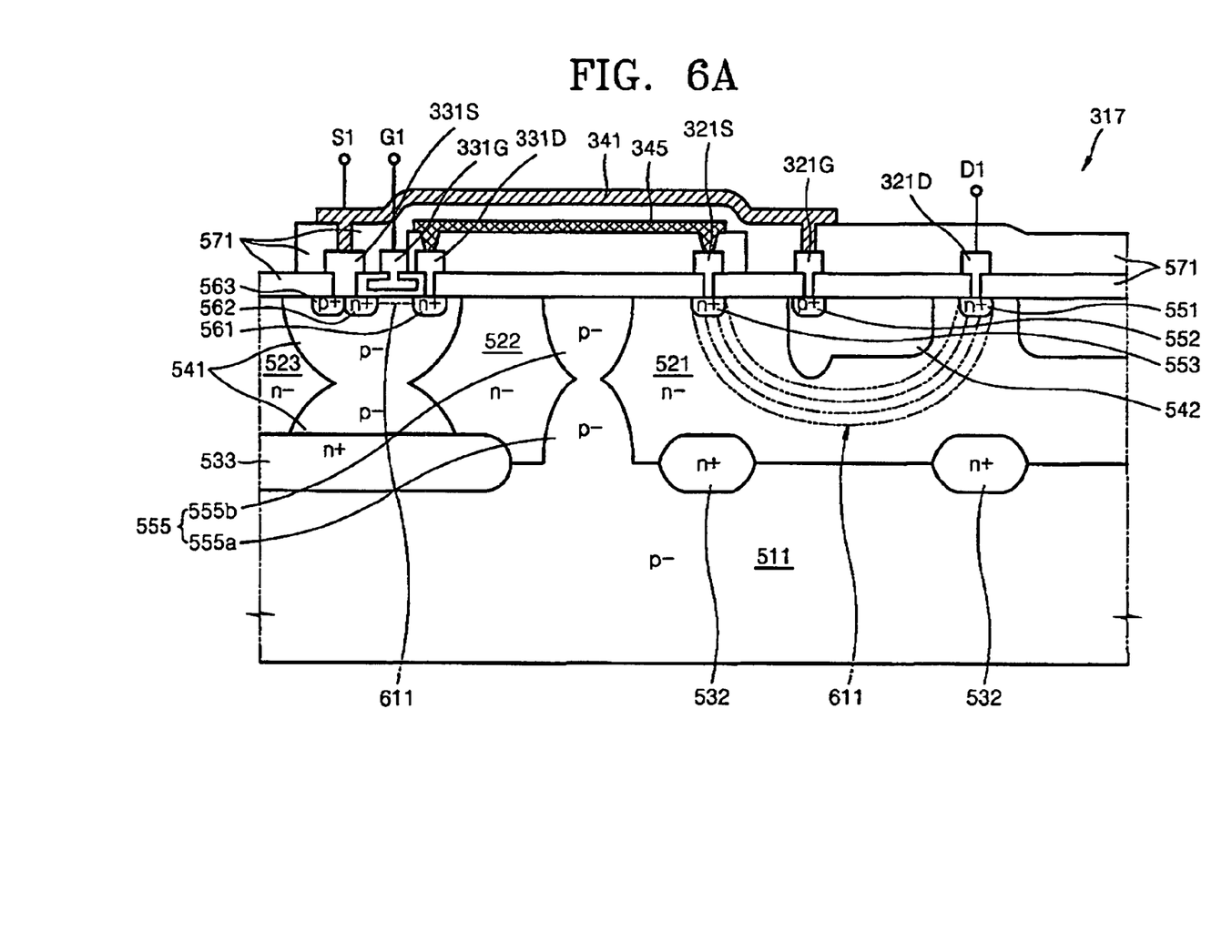

FIG. 6A is a cross-sectional view illustrating current flowing in the high-side power switch 317 when the high-side power switch 317 is turned on. The high-side power switch 317 may be turned on, for example, when ground voltage (i.e., 0V) is applied to a source terminal S1 of the high-side power switch 317, 15V is applied to a gate terminal G1 of the high-side power switch 317, and 1V is applied to a drain terminal D1 of the high-side power switch 317.

Referring to FIG. 6A, when the high-side power switch 317 is turned on, a current 611 flows from the first drain electrode 321D to the first drain area 551, the first source area 553, the first source electrode 321S, the second metal line or wiring 345, the second drain electrode 331D, the second drain area 561, the second source areas 562 and 563, and the second source electrode 331S. Thus, the high-side power switch 317 is stably turned on.

Figure 6B:
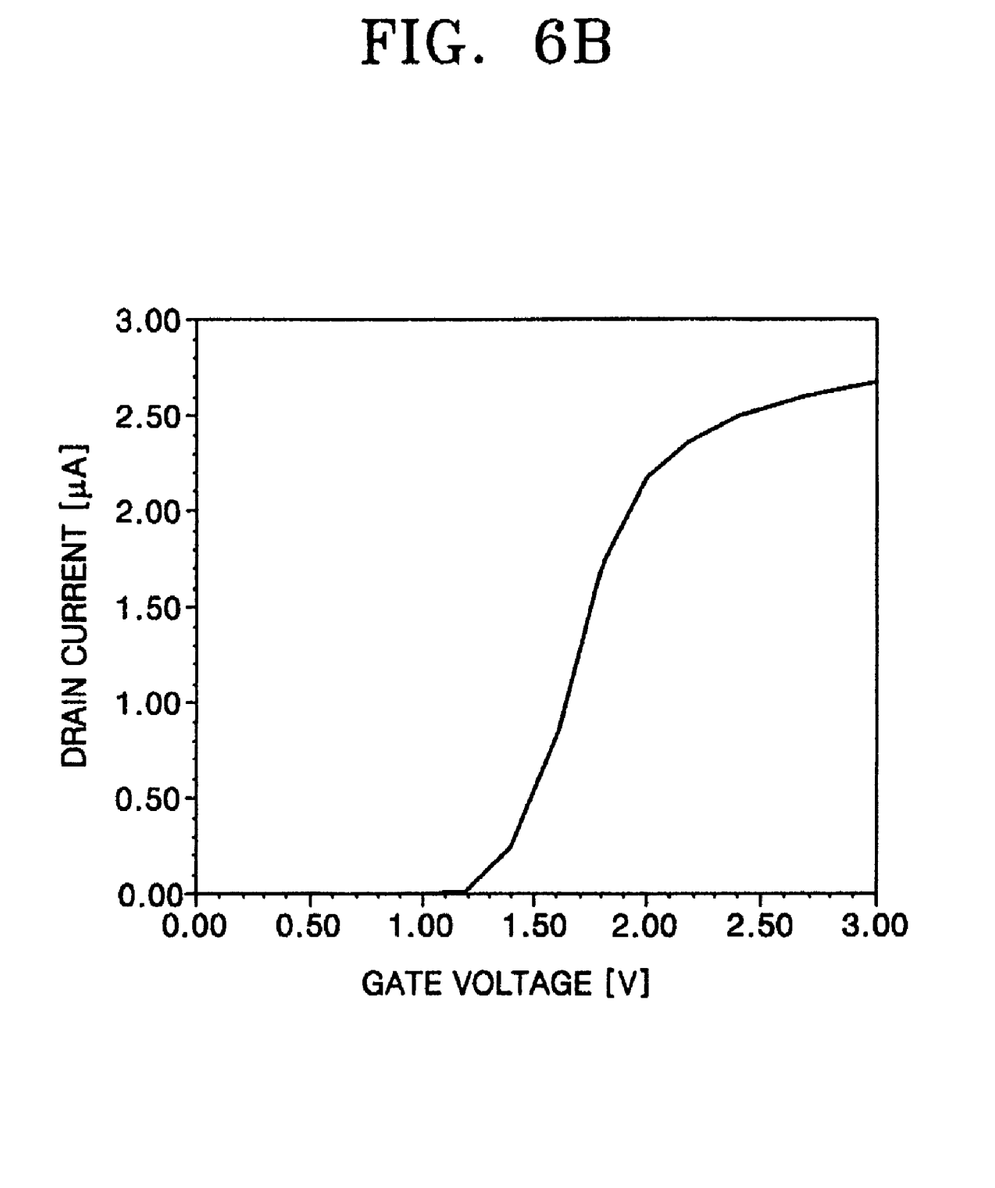

FIG. 6B is a graph illustrating a current characteristic of the high-side power switch 317 when the high-side power switch 317 is turned on. Referring to FIG. 6B, as soon as a gate voltage applied to the gate terminal G1 of the high-side power switch 317 exceeds the threshold voltage (e.g., 1.2V), a current starts to flow from the drain terminal D1 to the source terminal S1. This drain current increases with increase in the gate voltage. Thus, the high-side power switch 317 is stably turned on.

Figure 7A:
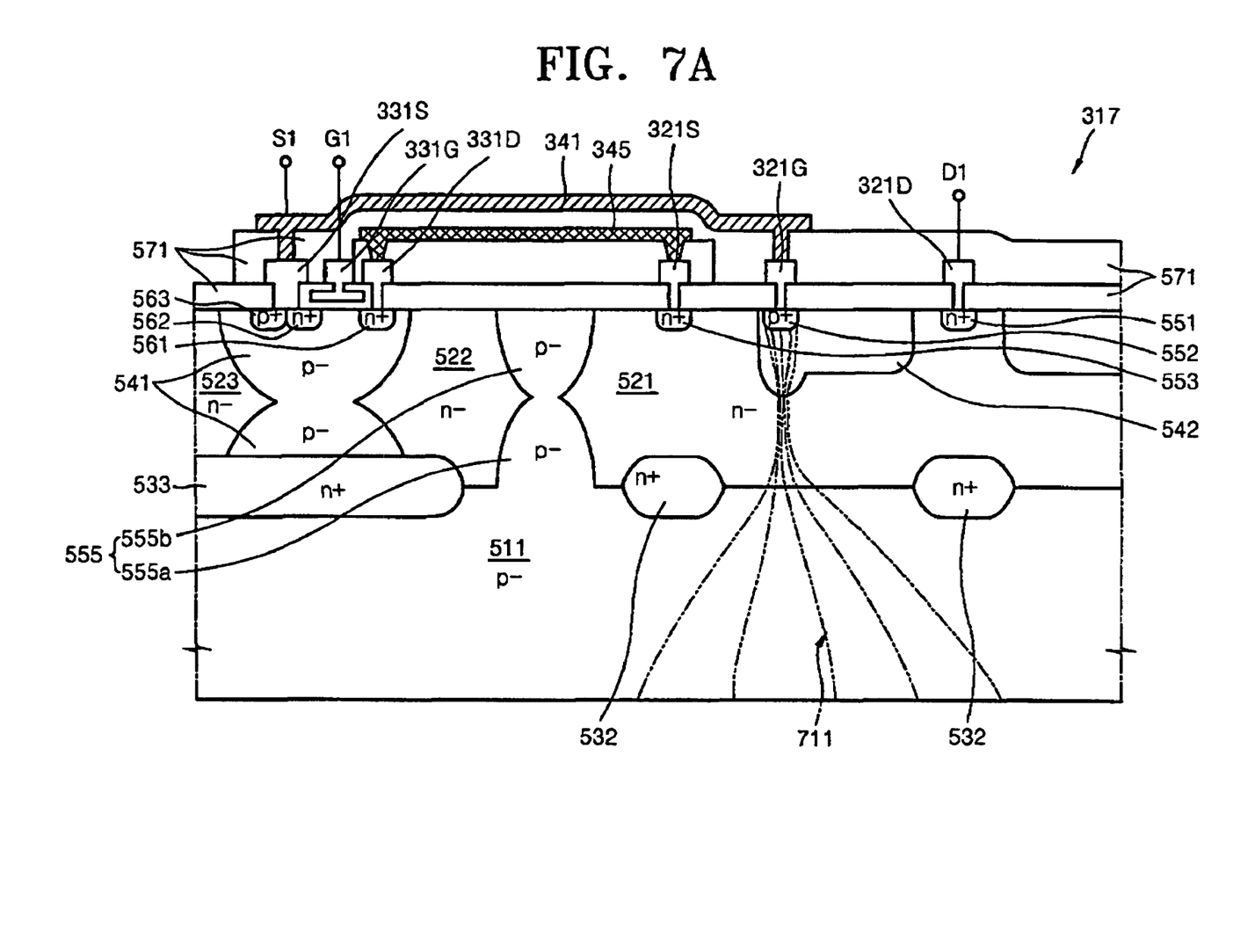
FIG. 7A is a cross-sectional view illustrating current flowing in the high-side power switch when a punch-through occurs in the high-side power switch.

FIG. 7A is a cross-sectional view illustrating current flowing in the high-side power switch 317 when a punch-through occurs in the high-side power switch 317. Punch-through may occur, for example, when a ground voltage (i.e., 0V) is applied to the drain terminal D1, the gate terminal G1, and the source terminal S1 of the high-side power switch 317, and the reference voltage Vs of the high voltage area 315 of the power integrated circuit device 301 (shown in FIG. 3) is −625V. In other words, as shown in FIG. 7A, when the source terminal S1 of the high-side power switch 317 floats and the reference voltage Vs of the high voltage area of the power integrated circuit device 301 (shown in FIG. 3) is −625V, the punch-through phenomenon occurs.

As described above, when a difference between the ground voltage GND and the reference voltage Vs of the high voltage area 315 of the power integrated circuit device 301 (shown in FIG. 3) is 625V or more, a punch-through occurs in which a current 711 sharply flows from the first source area 553 to the semiconductor substrate 511.

Figure 7B:
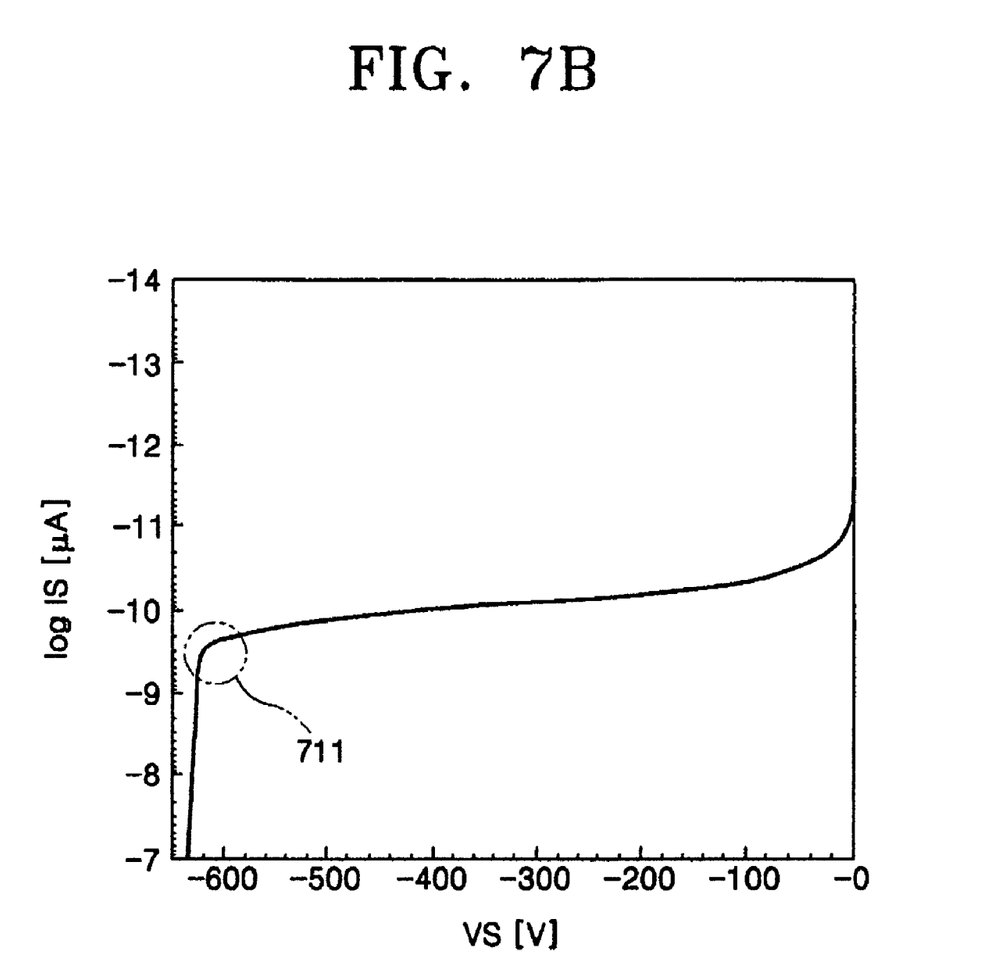
FIG. 7B is a graph illustrating a current characteristic of the high-side power switch when a punch-through occurs in the high-side power switch.

FIG. 7B is a graph illustrating a current characteristic of the high-side power switch 317 when a punch-through occurs in the high-side power switch. Referring to FIG. 7B, when the difference between the ground voltage GND of the power integrated circuit device 301 (shown in FIG. 3) and the reference voltage Vs of the high voltage area 315 of the power integrated circuit device 301 is 625V or less, a relatively little current flows in the high-side power switch 317. When the difference between the ground voltage GND and the reference voltage Vs of the high voltage area 315 of the power integrated circuit device 301 is 625V, punch-through occurs in the high-side power switch 317, and a substantial current flows from the first source area 553 to the semiconductor substrate 511.

Figure 8A:
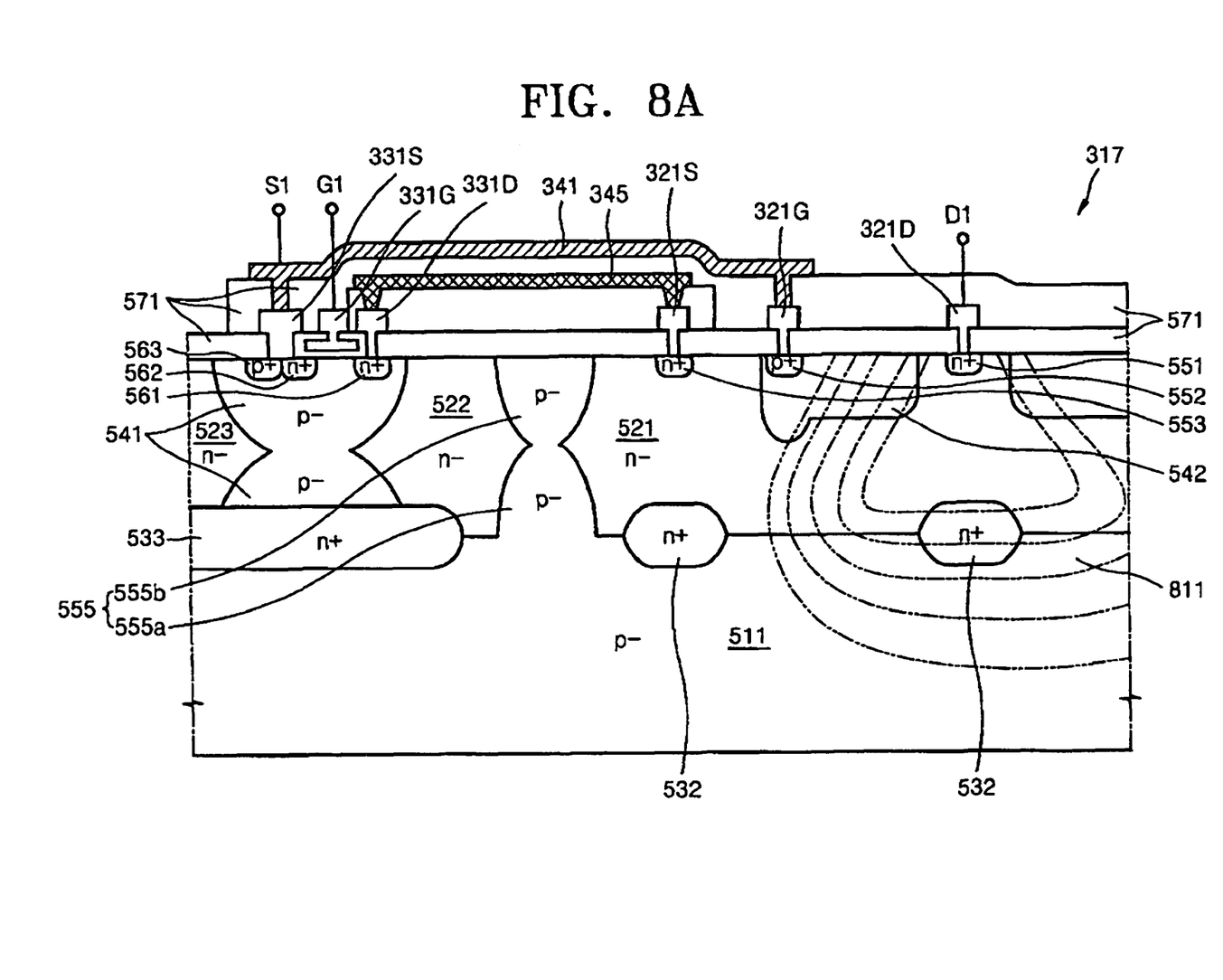
FIG. 8A is a cross-sectional view illustrating distribution of a voltage applied to the high-side power switch when a break-down occurs in the high-side power switch.

FIG. 8A is a cross-sectional view illustrating distribution of a voltage applied to the high-side power switch 317 when a break-down occurs in the high-side power switch 317. Break-down may occur, for example, when a ground voltage (i.e., 0V) is applied to the source terminal S1 and the gate terminal G1 of the high-side power switch 317, and a voltage between 1V and 650V is applied to the drain terminal D1.

As shown in FIG. 8A, as a drain voltage gradually increases from 1V, a depletion area 811 is expanded. When the drain voltage is 650V, the depletion area 811 expands to the semiconductor substrate 511.

Figure 8B:
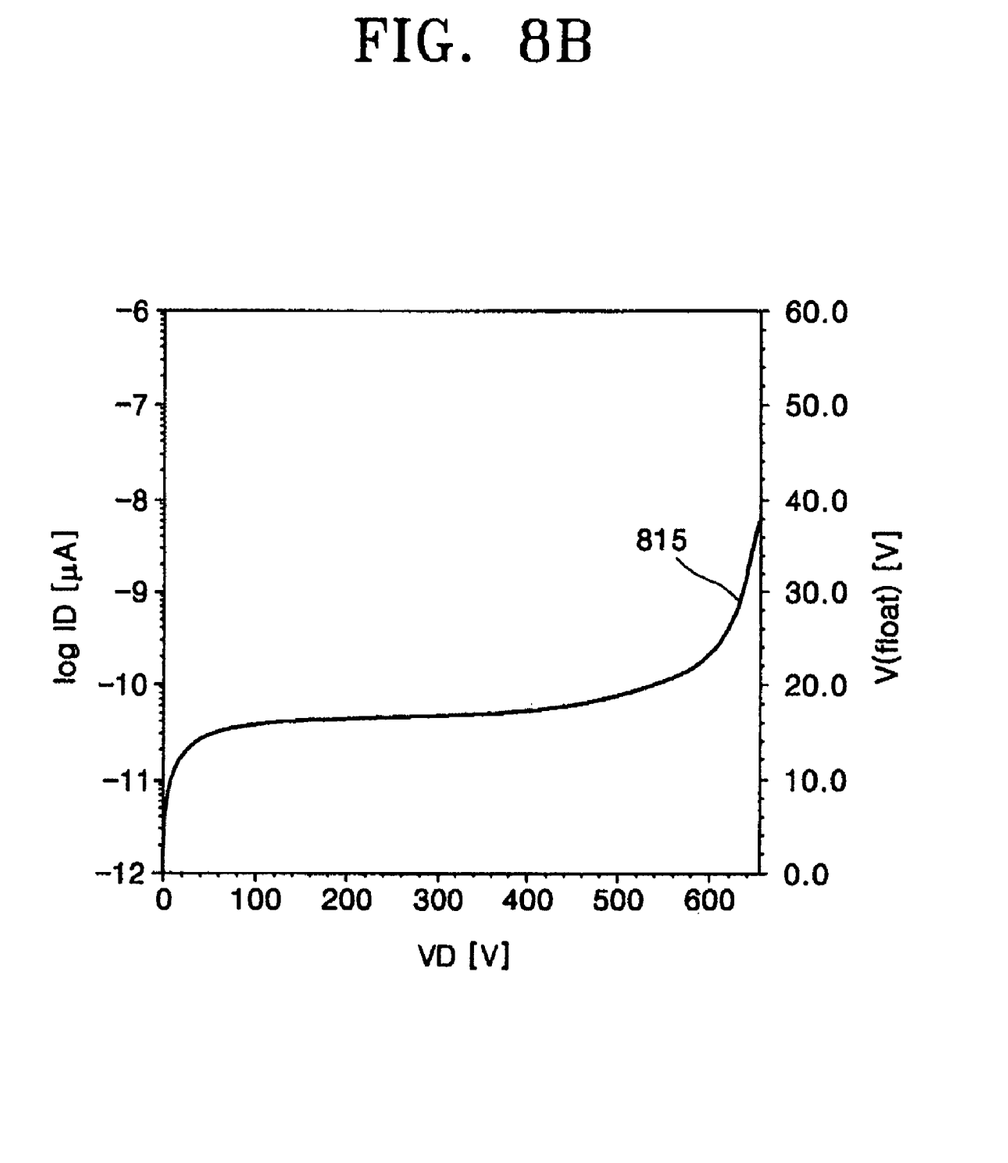
FIG. 8B is a graph illustrating a current characteristic of the high-side power switch when a break-down occurs.

FIG. 8B is a graph illustrating a current characteristic of the high-side power switch 317 when a break-down occurs. Referring to FIG. 8B, a drain current ID suddenly increases to a predetermined level in an initial stage in which a drain voltage VD is applied. When the drain voltage VD reaches 650V, breakdown phenomenon occurs in the high-side power switch 317, and the drain current ID sharply increases.

FIGS. 6A through 8B show that the high-side power switch 317 according to an embodiment of the present invention can stably perform a switching operation. As described above, high-side power switch 317 may include a high voltage transistor 321 (which can be an N-channel JFET) and a low voltage transistor 331 (which can be an N-channel MOSFET). The body area 541 can be widely and deeply formed in the epitaxial layers 522 and 523, and the drain area 561 and the source areas 562 and 563 of the low voltage transistor 331 can be formed in the upper portion of the body area 541. Thus, in the high-side power switch 317, the displacement voltage dV/dt and the occurrence of a punch-through is improved. Accordingly, the high-side power switch 317 can stably perform the switch operation.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A power integrated circuit device, comprising:
a semiconductor substrate;
an epitaxial layer formed on the semiconductor substrate;
a first drain area formed in an upper portion of the epitaxial layer;
a first body area formed in the upper portion of the epitaxial layer apart from the first drain area;
a first gate area formed in an upper portion of the first body area;
a first source area formed in the upper portion of the epitaxial layer apart from the first body area;
a second body area having a low concentration of p-type dopant and formed in the epitaxial layer and apart from the first body area;
a buried layer having a high concentration of n-type dopant and formed between the second body area and the semiconductor substrate in a vertical direction;
a second drain area formed in an upper portion of the second body area;
a second source area formed in the upper portion of the second body area apart from the second drain area;
a gate electrode formed in an upper portion between the second drain area and the second source area;
a first metal line formed on an upper surface of the epitaxial layer and electrically connecting the first gate area to the second source area; and
a second metal line formed on the upper surface of the epitaxial layer and electrically connecting the first source area to the second drain area.

2. The power integrated circuit device of claim 1, wherein the first drain area and the first source area have a high concentration of n-type dopant, and the first gate area has a concentration of p-type dopant.

3. The power integrated circuit device of claim 1, wherein the first body area has a low concentration of p-type dopant.

4. The power integrated circuit device of claim 1 further comprising buried layers formed below the first drain area and the first source area, the buried layers having a high concentration of n-type dopants.

5. The power integrated circuit device of claim 1, further comprising an isolation area for isolating the second body area from the first drain area, the first body area, and the first source area.

6. The power integrated circuit device of claim 1, wherein the second source area comprises a first area having a high concentration of n-type dopant and a second area having a high concentration of p-type dopant.

7. The power integrated circuit device of claim 1, wherein the second drain area has a high concentration of n-type dopant.

8. The power integrated circuit device of claim 1, wherein the buried layer has a high concentration of n-type dopant.

9. The power integrated circuit device of claim 1, further comprising:
a first drain electrode contacting the first drain area;
a first gate electrode contacting the first gate area;
a first source electrode contacting the first source area;
a second drain electrode contacting the second drain area; and
a second source electrode contacting the second source area.

10. The power integrated circuit device of claim 9, wherein the first metal line connects the first gate electrode to the second source electrode.

11. The power integrated circuit device of claim 9, wherein the second metal line connects the first source electrode to the second drain electrode.

12. The power integrated circuit device of claim 5, wherein the isolation area comprises:
a buried layer having a low concentration of p-type dopant; and
an impurity layer formed on and in contact with the buried layer, the impurity layer having a low concentration of p-type dopant.

* * * * *